United States Patent
Kim et al.

(10) Patent No.: US 10,693,499 B2
(45) Date of Patent: Jun. 23, 2020

(54) APPARATUS AND METHOD FOR LDPC ENCODING SUITABLE FOR HIGHLY RELIABLE AND LOW LATENCY COMMUNICATION

(71) Applicant: INDUSTRY-ACADEMIC COOPERATION FOUNDATION, YONSEI UNIVERSITY, Seoul (KR)

(72) Inventors: Kwang-Soon Kim, Seoul (KR); Ki Jun Jeon, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 61 days.

(21) Appl. No.: 16/070,252

(22) PCT Filed: Feb. 17, 2016

(86) PCT No.: PCT/KR2016/001601
§ 371 (c)(1),
(2) Date: Jul. 13, 2018

(87) PCT Pub. No.: WO2017/126733
PCT Pub. Date: Jul. 27, 2017

(65) Prior Publication Data
US 2019/0036547 A1 Jan. 31, 2019

(30) Foreign Application Priority Data
Jan. 19, 2016 (KR) .................. 10-2016-0006595

(51) Int. Cl.
*H03M 13/00* (2006.01)
*H03M 13/11* (2006.01)
*H03M 13/03* (2006.01)

(52) U.S. Cl.
CPC ....... *H03M 13/118* (2013.01); *H03M 13/036* (2013.01); *H03M 13/1197* (2013.01); *H03M 13/611* (2013.01); *H03M 13/6502* (2013.01)

(58) Field of Classification Search
None
See application file for complete search history.

(56) References Cited

U.S. PATENT DOCUMENTS 6,633,856 B2 * 10/2003 Richardson .............. G06N 3/02
706/15
6,895,547 B2 * 5/2005 Eleftheriou ........ G11B 20/1833
714/801

(Continued)

FOREIGN PATENT DOCUMENTS

WO WO 2015-016668 A1 2/2015

*Primary Examiner* — Mujtaba M Chaudry

(57) ABSTRACT

Disclosed are an apparatus and a method for LDPC encoding suitable for highly reliable and low latency communication. The disclosed apparatus comprises: a second inner encoding module for outputting parity bits by means of single parity calculations and accumulation device calculations using bit strings outputted from a first inner encoding module; and the first inner encoding module for outputting a part of the parity bits by means of single parity check calculations for the bits output from a second outer module, and for outputting rest of the parity bit strings by means of single parity check calculations and accumulation device calculations, with a part of the parity bits output by the second inner encoding module as an additional input.

9 Claims, 6 Drawing Sheets

(56) References Cited

U.S. PATENT DOCUMENTS

| | | | |
|---|---|---|---|
| 7,072,417 B1* | 7/2006 | Burd | H03M 13/118 375/295 |
| 9,083,383 B1* | 7/2015 | Tunali | H03M 13/1197 |
| 9,203,440 B1* | 12/2015 | Tunali | H03M 13/2906 |
| 2004/0148560 A1* | 7/2004 | Hocevar | H03M 13/116 714/801 |
| 2005/0289443 A1* | 12/2005 | Kuznetsov | G11B 20/1426 714/792 |
| 2006/0294445 A1* | 12/2006 | Divsalar | H03M 13/1194 714/752 |
| 2008/0106426 A1 | 1/2008 | Li et al. | |
| 2011/0246863 A1* | 10/2011 | Miyauchi | G11B 20/1833 714/788 |
| 2015/0085951 A1 | 3/2015 | Shin et al. | |

* cited by examiner

APPARATUS AND METHOD FOR LDPC ENCODING SUITABLE FOR HIGHLY RELIABLE AND LOW LATENCY COMMUNICATION

CROSS-REFERENCE TO RELATED APPLICATIONS

This application is a National Phase Application of PCT International Application No. PCT/KR2016/001601, which was filed on Feb. 17, 2016, and which claims priority from Korean Patent Application No. 10-2016-0006595 filed with the Korean Intellectual Property Office on Jan. 19, 2016. The disclosures of the above patent applications are incorporated herein by reference in their entirety.

BACKGROUND

1. Technical Field

The present invention relates to an apparatus and a method for LDPC encoding for highly reliable and low latency communication.

2. Description of the Related Art

Research on LDPC (low density parity check) is actively under way, due to the advantages of near-optimal performance, efficient encoding and decoding capabilities based on parallel processing, and easiness of hardware design.

In recent times, research is being conducted on fifth-generation mobile communication systems, and the demands required of a fifth-generation mobile communication system include more stringent standards as regards high reliability and low latency properties.

Also, the next-generation sensor network has to transmit and receive large quantities of data in real time at a low power and without delays, and as such requires code design that ensures high reliability and allows encoding with low complexity.

The types of LDPC codes currently known include RU (Richardson-Urbanke) code, RMA (repeat multiple accumulate) code, ARA (accumulate repeat accumulate) code, ARJA (accumulate repeat jagged accumulate) code, etc.

These codes face the following problems when attempting to satisfy the requirements for high reliability and low latency simultaneously.

The RU code enables efficient encoding but cannot ensure high reliability due to inferior encoding threshold and error floor properties, where such phenomenon is exacerbated with lower code rates.

The RMA code enables efficient encoding and offers excellent error floor properties due to its linear minimum distance growth (LMDG) property but cannot ensure high reliability because of inferior decoding threshold properties, and this phenomenon is likewise exacerbated with lower code rates.

The ARA code enables highly superb decoding thresholds and low complexity encoding but lacks the LMDG property, so that the weak error floor property cannot ensure a high reliability.

The ARJA code offers superior decoding threshold and LMDG properties and thus can ensure high reliability but entails a high encoding complexity, which poses problems for low latency communication.

SUMMARY OF THE INVENTION

The present invention proposes a LDPC encoding method and apparatus that are suitable for high reliability and low latency communication.

One aspect of the present invention provides an apparatus for LDPC encoding that includes: a first outer encoding module configured to output a pre-coding bit string by using a portion of the information bit strings that are to be encoded; a second outer encoding module configured to perform repetition and permutation operations for the pre-coding bit string and a remainder of the information bit strings; a first inner encoding module configured to output a portion of parity bit strings by way of a single parity check operation on bit strings outputted from the second outer encoding module; and a second inner encoding module configured to output parity bit strings by way of an accumulator operation with the bit strings outputted from the second outer encoding module and the portion of parity bit strings outputted from the first inner encoding module used as input, where the first inner encoding module uses a portion of parity bits outputted from the second inner encoding module as additional input in outputting a remainder of parity bit strings by way of an accumulator operation.

The first outer encoding module may output the pre-coding bits by way of an accumulator operation.

The first inner encoding module and the second inner encoding module may be connected via an outer connection line, and the portion of the parity bit strings of the second inner encoding module may be inputted to the first inner encoding module via the outer connection line.

The first outer encoding module may include a multiple number of variable nodes and check nodes, and the check nodes and variable nodes may be connected as a zigzag closed loop having a connection degree of 2.

The variable nodes of the second outer encoding module may be connected with check nodes of the first inner encoding module and the second inner encoding modules in multiple connection degrees.

In the first inner encoding module, a portion of the variable nodes and a portion of the check nodes may be connected in a connection degree of 1, and remainders of the variable nodes and the check nodes may be connected in a connection degree of 2.

In the second inner encoding module, at least one variable node may be connected with at least one check node of the first inner encoding module via the outer connection line.

Another aspect of the present invention provides an apparatus for LDPC encoding that includes: a first outer encoding module configured to output a pre-coding bit string by using a portion of the information bit strings that are to be encoded; a second outer encoding module configured to perform repetition and permutation operations for the pre-coding bit string and a remainder of the information bit strings; a first inner encoding module connected with the second outer encoding module, where a portion of the variable nodes and a portion of the check nodes are connected in a connection degree of 1 and remainders of the variable nodes and the check nodes are connected in a connection degree of 2; and a second inner encoding module connected with the second outer encoding module, where at least one variable node is connected via an outer connection line with at least one check node of the first inner encoding module having a connection degree of 2.

Also provided is a method for LDPC encoding that includes: a first outer encoding step of outputting a pre-coding bit string by using a portion of information bit strings that are to be encoded; a second outer encoding step of performing repetition and permutation operations for the pre-coding bit string and a remainder of the information bit strings; a first inner encoding step of outputting a portion of parity bit strings by way of a single parity check operation on bit strings outputted in the second outer encoding step; and a second inner encoding step of outputting parity bit strings by way of a single parity check operation and an accumulator operation using bit strings outputted in the second outer encoding step and a portion of parity bit strings outputted in the first inner encoding step, where the first inner encoding step uses a portion of parity bits outputted in the second inner encoding step as input in outputting a remainder of parity bit strings by way of a single parity check operation and an accumulator operation.

An apparatus and a method for LDPC encoding according to the present invention provide the advantage of enabling LDPC code that allows low complexity encoding while ensuring high reliability.

DETAILED DESCRIPTION OF THE INVENTION

Figure 1:
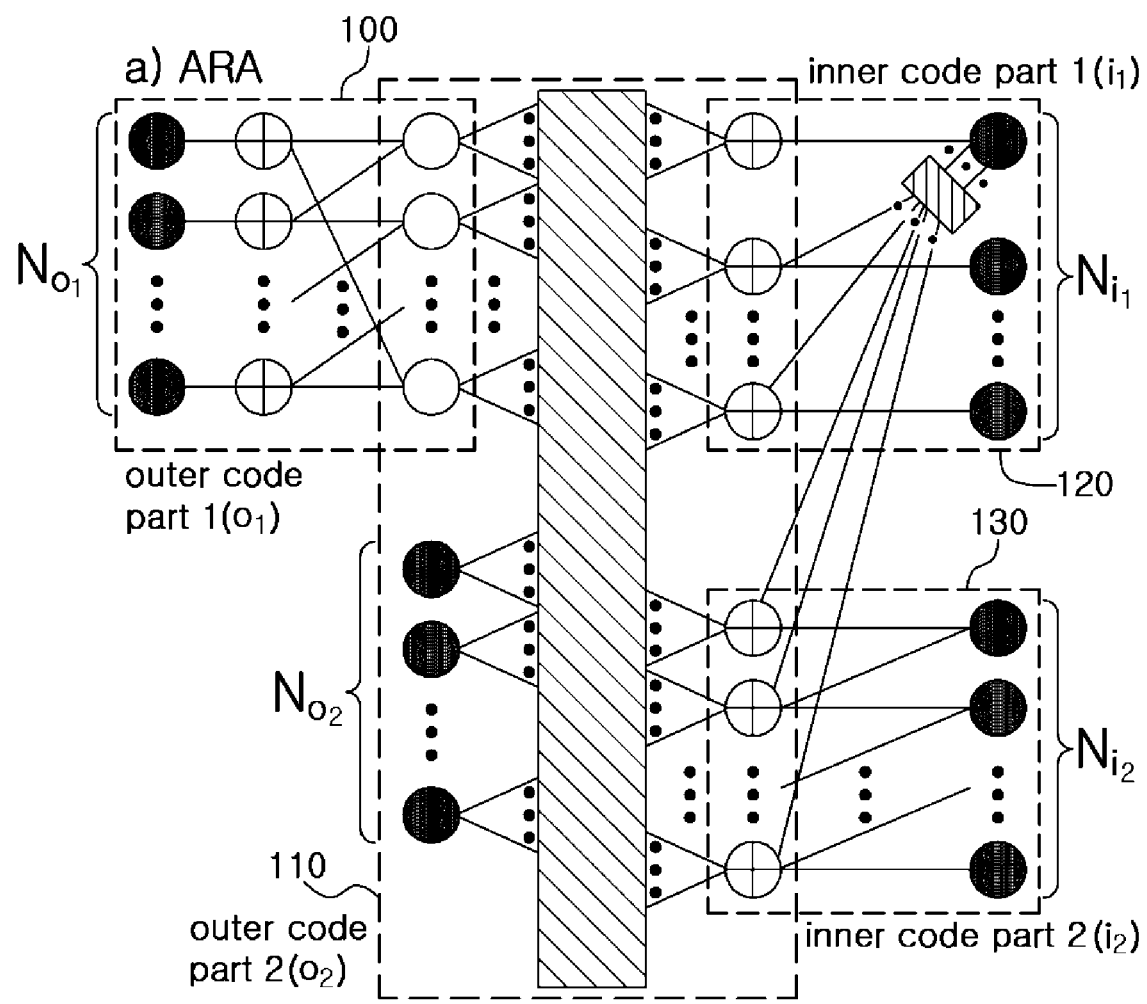
FIG. 1 illustrates the protograph connection states of an ARA code.

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In describing the present invention, specific descriptions of relevant known technology are omitted if it is deemed that such descriptions may obscure the essence of the present invention.

While such terms as "first" and "second," etc., may be used to describe various elements, such elements must not be limited to the above terms. The above terms are used only to distinguish one element from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

A detailed description of certain embodiments of the present invention will be provided below with reference to the accompanying drawings. Before the description of the present invention, the ARA code and the ARJA code are first considered, as conventional types of LDPC code.

FIG. 1 illustrates the protograph connection states of an ARA code.

Referring to FIG. 1, the protograph of an ARA code may include a first outer code part 100, a second outer code part 110, a first inner code part 120, and a second inner code part 130.

In FIG. 1, a black circle represents a variable node, a white circle represents a punctured variable node, and a grey circle with a '+' marked therein represents a check node. A variable node can be defined as an information bit string or a bit string generated by way of a check node operation on an information bit string. In FIG. 1, the variable nodes positioned on the far left are the nodes where information bit strings are inputted, while the variable nodes positioned on the far right are the nodes where parity bit strings generated from the information bit strings are outputted.

In FIG. 1, the variable nodes on the right within the first outer code part 100 are variable nodes in a punctured state and have a zigzag closed loop (ZCL) connection state of degree 2. It can be observed from FIG. 1 that the check nodes and the variable nodes of a punctured state may be connected in a zigzag state. Such connection state of the first outer code part 100 in the ARA code may enable the function of an accumulator operation module.

The second outer code part 110 may be composed of variable nodes, including a multiple number of variable nodes in a punctured state. The variable nodes of the second outer code part 110 may be connected with the check nodes of the first and second inner code parts 120, 130 in multiple connection degrees and may form a connection state of a closed loop form.

In the first inner code part 120, the check nodes and the variable nodes may have a connection structure that enables a single parity check operation, from which elementwise XOR operation results may be outputted for multiple input bit strings of the variable nodes connected to the check nodes. The first inner code part 120 may have the connection state of a degree-1 OL with a high-degree node.

The first inner code part 120 may be a low density generator matrix (LDGM) code and may generate parity bit strings in a simple manner by way of a single parity check operation, providing additional code gains.

The second inner code part 130 may have the connection state of a zigzag closed loop having a connection degree of 2.

In the ARA code illustrated in FIG. 1, the first outer code part 100 may perform an accumulator operation, the second outer code part 110 may perform repetition and permutation operations, the first inner code part 120 may perform a single parity check operation, and the second inner code part 130 may perform a single parity check operation and an accumulator operation, to enable low complexity encoding and offer an excellent decoding threshold value.

However, the ARA code lacks the LMDG property and may be weak in terms of its error floor properties.

Figure 2:
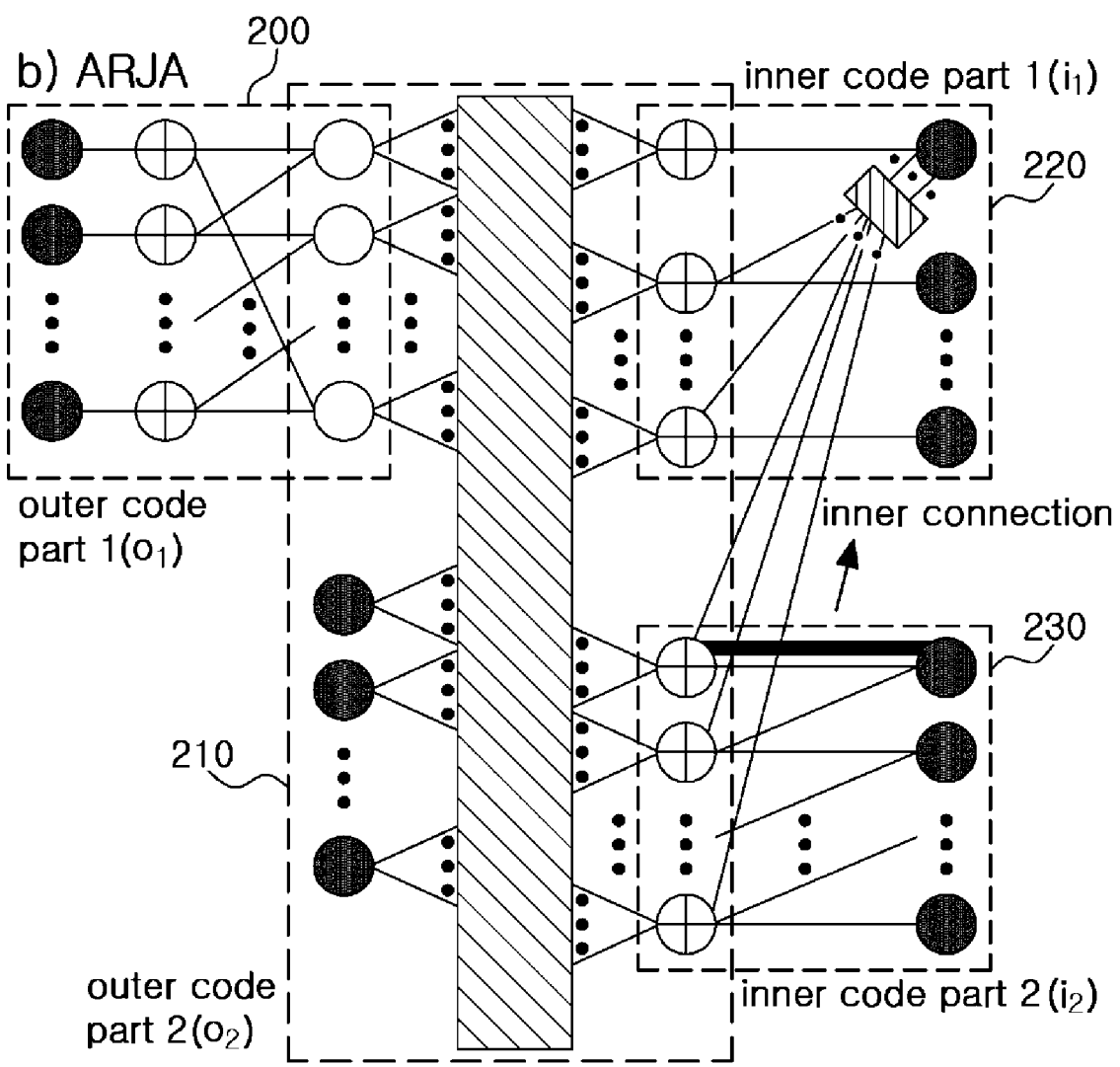
FIG. 2 illustrates the protograph connection states of an ARJA code.

FIG. 2 illustrates the protograph connection states of an ARJA code.

Referring to FIG. 2, the protograph of an ARJA code may also include a first outer code part 200, a second outer code part 210, a first inner code part 220, and a second inner code part 230.

In the ARJA code, the structures of the first outer code part 200, second outer code part 210, and first inner code part 220 may be the same as those for the ARA code.

The ARJA may differ from the ARA code in the structure of the second inner code part 230. The second inner code part 230 of the ARA code may have a connection degree of 2 and may have the form of an accumulator. However, the second inner code part 230 of the ARJA code may include an additional inner connection line at a portion of the check nodes and variable nodes.

Due to the additional inner connection line, the second inner code part 230 may no longer have the connection state of a zigzag closed loop of connection degree 2, and as such, the second inner code part 230 of the ARJA code may no longer function as an accumulator. Thus, the encoding of such ARJA code is possible only with the use of a BCSGM (block-circulant systematic generator matrix) having high density properties designed from a parity check matrix.

Ultimately, while the ARJA code can be regarded as a code that compensates the LMDG property to ensure high reliability, there is the problem that the complexity of the operations may be increased because the second inner code part 230 no longer functions as an accumulator.

Figure 3:
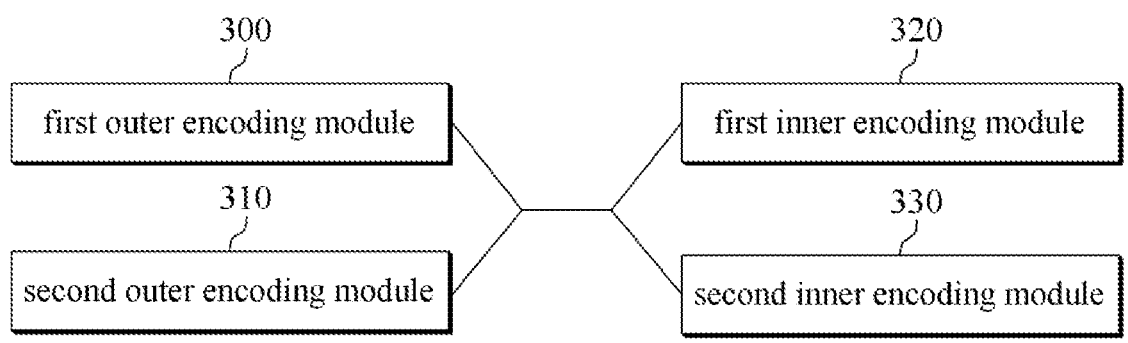
FIG. 3 is a block diagram illustrating the structure of a LDPC encoding apparatus for generating code according to an embodiment of the present invention.
Figure 4:
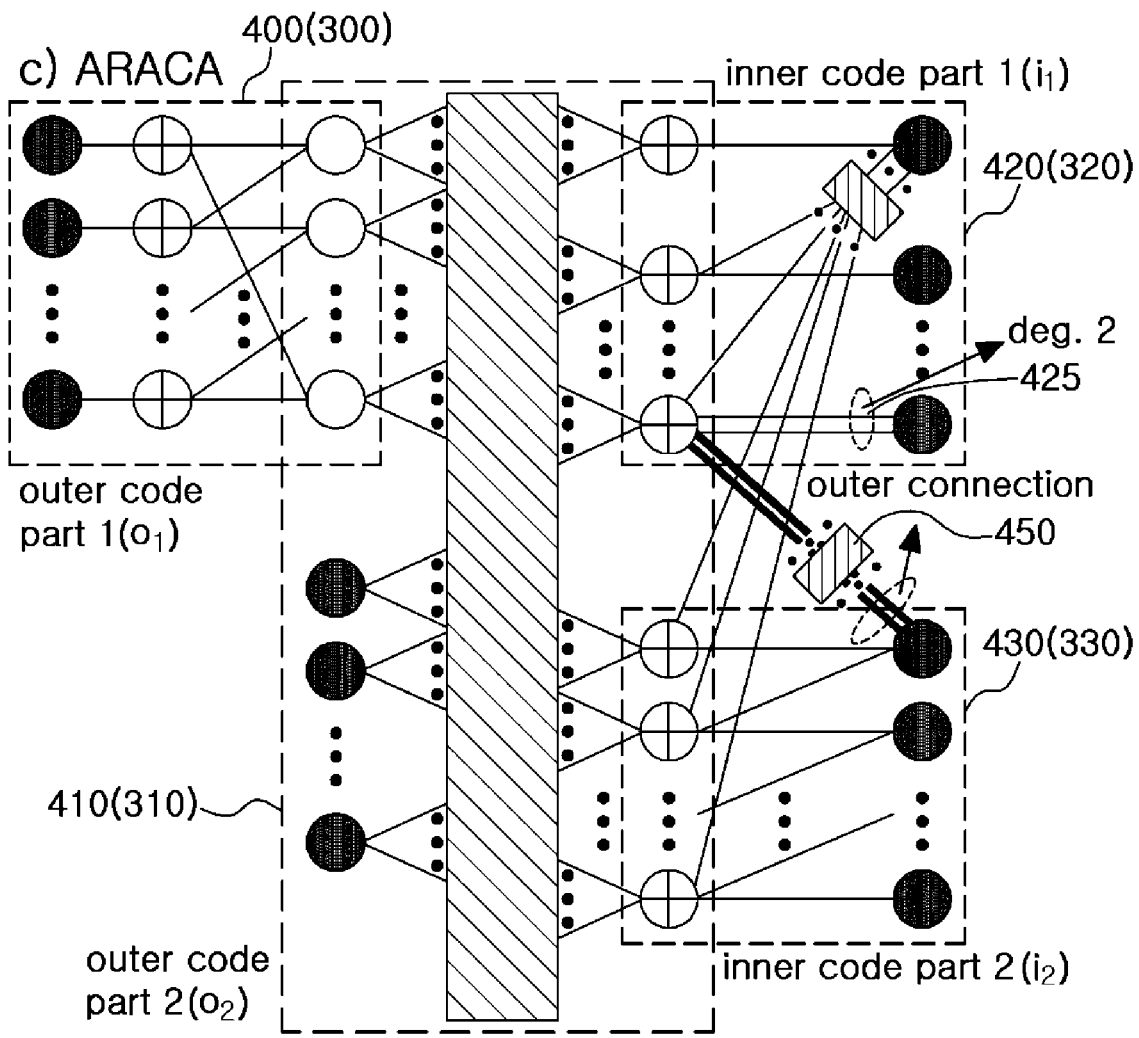
FIG. 4 illustrates the protograph connection states of a LDPC encoding apparatus for generating code according to an embodiment of the present invention.

FIG. 3 is a block diagram illustrating the structure of a LDPC encoding apparatus for generating code according to an embodiment of the present invention, and FIG. 4 illustrates the protograph connection states of a LDPC encoding apparatus for generating code according to an embodiment of the present invention.

Referring to FIG. 3, a LDPC encoding apparatus for generating code according to an embodiment of the present invention may include a first outer encoding module 300, a second outer encoding module 310, a first inner encoding module 320, and a second inner encoding module 330. Also, illustrated in FIG. 4 are a first outer code part 400, which illustrates the protograph connection state of the first outer encoding module 300, a second outer code part 410, which illustrates the protograph connection state of the second outer encoding module 310, a first inner code part 420, which illustrates the protograph connection state of the first inner encoding module 320, and a second inner code part 430, which illustrates the protograph connection state of the second inner encoding module 330.

To the first outer encoding module 300 and the second outer encoding module 310, the information bit strings for encoding may be inputted. A portion of the information bit strings may be inputted to the first outer encoding module 300, and the remaining portion of the information bit strings may be inputted to the second outer encoding module 310.

The first outer encoding module 300 may use the inputted information bit strings to output pre-coding bit strings, for generating parity bit strings. The first outer encoding module 300 may output the pre-coding bit strings for generating parity bit strings by way of an accumulator operation.

Referring to FIG. 4, the first outer encoding module 300 may include multiple variable nodes, multiple check nodes, and connection lines between nodes.

From among the multiple variable nodes, the variable nodes on the left may be the nodes to which the information bit strings are inputted, and the variable nodes on the right, which are punctured variable nodes, may be the pre-coding parity bit strings from the information bit strings.

The variable nodes and check nodes of the first outer encoding module 300 have the connection state of a zigzag closed loop having a connection degree of 2, and as described above, the connection structure of an accumulator allows encoding by an accumulator operation at the first outer encoding module 300.

The remaining information bit strings not inputted to the first outer encoding module 300 and the output bit strings of the first outer encoding module 300 may be inputted to the second outer encoding module 310, where the second outer encoding module 310 may include punctured variable nodes together with multiple variable nodes.

The second outer encoding module 310 may perform repetition and permutation operations for obtaining encoding gain and interleaving gain at the first inner encoding module 320 and the second inner encoding module 330.

The variable nodes of the second outer encoding module 310 may be connected with the check nodes of the first inner encoding module 320 and second inner encoding module 330 to have the connection state of a multiple connection degree closed loop.

The first outer encoding module 300 and the second outer encoding module 310 may be connected with the first inner encoding module 320 and the second inner encoding module 330, and the output bit strings of the second outer encoding module 310 may be inputted to the check nodes of the first inner encoding module 320 and the second inner encoding module 330.

The first inner encoding module 320 and the second inner encoding module 330 may use the bit strings outputted from the second outer encoding modules 310 to generate the final parity bit strings.

The check nodes of the first inner encoding module 320 and second inner encoding module 330 may be connected with the variable nodes of the second outer encoding module 310 to receive input of the output bit strings.

The first inner encoding module 320 may generate most of the parity bit strings by way of a single parity check operation. However, a portion of the parity bit strings of the first inner encoding module 320 may be generated by way of a single parity check operation and an accumulator operation.

Referring to FIG. 4, it can be observed that, in the first inner encoding module 320, portions of the check nodes and variable nodes may have connection lines 425 of connection degree 2, unlike the ARA code and the ARJA code, and the nodes connected with the connection lines of connection degree 2 may output parity bit strings by way of a single parity check operation and an accumulator operation.

Also, the part of the first inner encoding module 320 that outputs parity bit strings by way of a single parity check operation and an accumulator operation may utilize a portion of the parity bit strings outputted from the second inner encoding module 330 as input for the check nodes in outputting the parity bit strings.

Referring to FIG. 4, portions of the check nodes of the first inner encoding module 320 and the variable nodes of the second inner encoding module 430 may be connected by way of outer connection lines 450.

The second inner encoding module 330 may output parity bit strings by way of the variable nodes by using a single parity check operation and an accumulator operation on the bit strings inputted from the second outer encoding module 310.

In the LDPC code based on an embodiment of the present invention, the inner connection line of the first inner encoding module 320 and the outer connection line between the second inner encoding module 330 and the first inner encoding module 320 satisfy LMDG properties.

Also, since an accumulator operation structure may be maintained in the second inner encoding module 330, there is the advantage that encoding can be performed with a low level of complexity, in contrast to the ARJA code. Since only the single parity check operation and the accumulator operation may be performed in the first inner encoding module 320 as well, encoding of a low complexity is possible.

A portion of the parity bit strings may be sequentially outputted by way of a single parity check operation at the first inner encoding module 320, and a portion of the parity bit strings may be outputted by way of an accumulator operation by using a portion of the parity bit strings outputted at the second inner encoding module 430.

Figure 5:
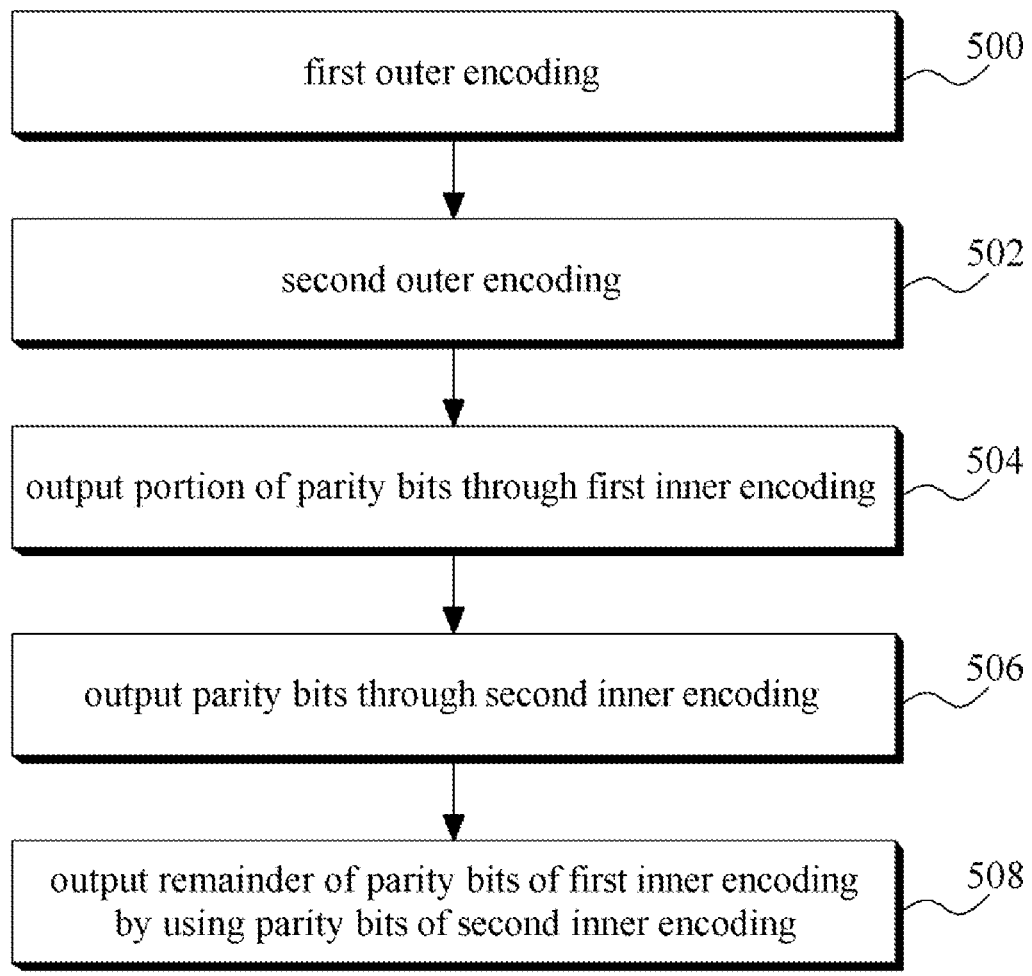
FIG. 5 illustrates the overall flow of a LDPC encoding method according to an embodiment of the present invention.

FIG. 5 illustrates the overall flow of a LDPC encoding method according to an embodiment of the present invention.

Referring to FIG. 5, a first outer encoding may be performed, where pre-coding bit strings may be outputted using a portion of the information bit strings from among the information bit strings that are to be encoded (step 500). In the first outer encoding, the pre-coding bit strings may be outputted by way of an accumulator operation.

Also, a second outer encoding may be performed, where repetition and permutation operations may be performed for the information bit strings that are to be encoded (step 502).

A first inner encoding may be performed, where a portion of the parity bit strings may be outputted by way of a single parity check operation by using the bit strings outputted by the second outer encoding (step 504).

A second inner encoding may be performed, where parity bit strings may be outputted by way of a single parity check operation and an accumulator operation by using a portion of the bit strings outputted by the second outer encoding and the first inner encoding (step 506).

The remaining parity bit strings of the first inner encoding may be outputted by way of a single parity check operation and an accumulator operation by using a portion of the parity bit strings outputted by the second outer encoding and the second inner encoding (step 508).

Figure 6:
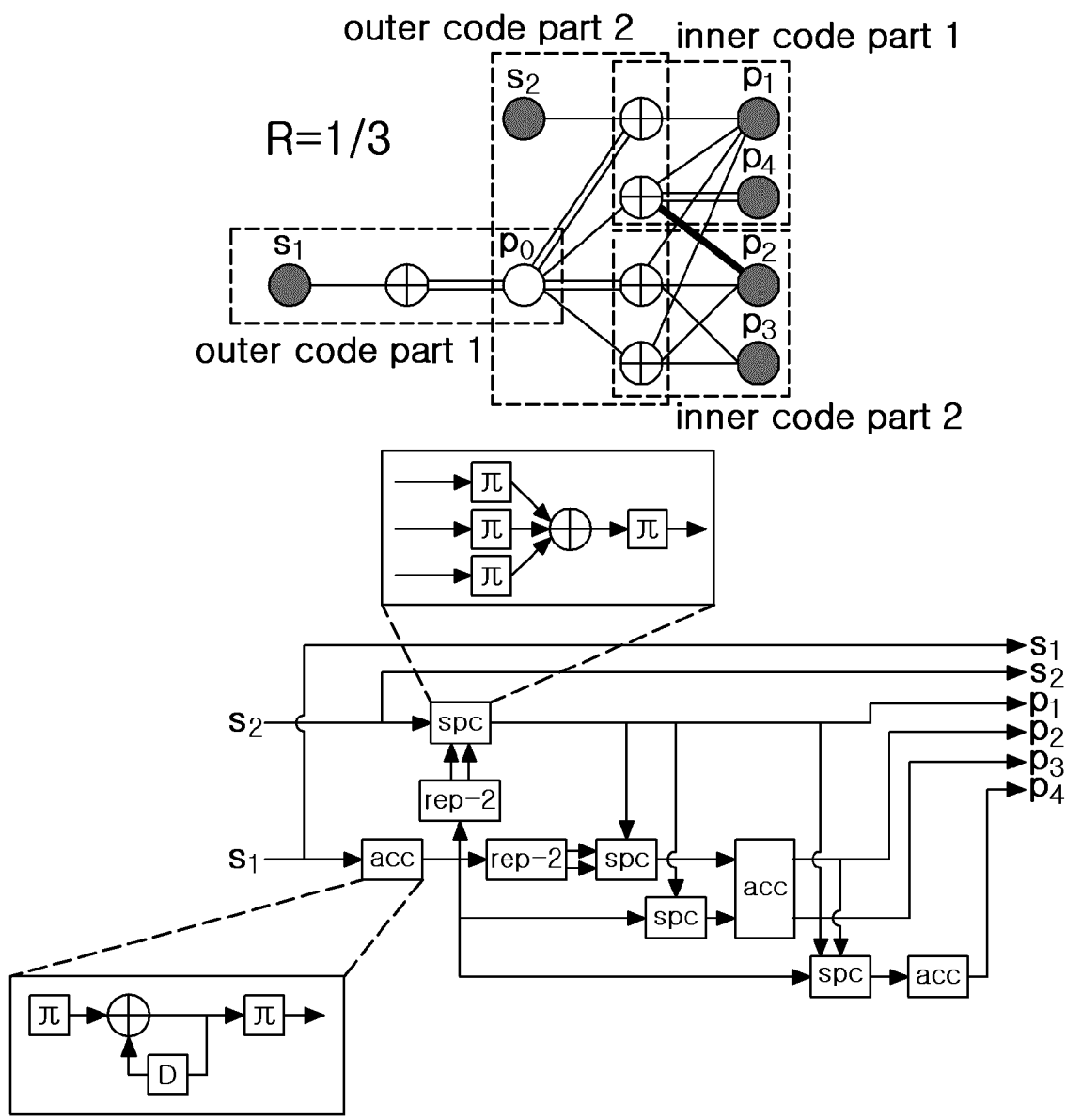
FIG. 6 illustrates a protograph proposed as an embodiment of the present invention and the encoding process.

FIG. 6 illustrates a protograph having a code rate of 1/3 proposed as an embodiment and the encoding process. Here, the spc block and the acc block represent a process of performing a permutation operation and a single parity check operation followed by a permutation operation and a process of performing a permutation operation and an accumulator operation followed by a permutation operation, respectively, and the process for encoding the illustrated protograph having a code rate of 1/3 may be as follows.

1) With the first outer encoding process, the information bit string $s_1$ may pass through the accumulator block to generate a pre-coding bit string $p_0$; 2) with the second outer encoding process, a multiple number of output bit strings may be generated by way of repetition on the information bit string $s_2$ and the pre-coding bit string $p_0$ (in the second inner encoding process, the permutation process may be included as the spc block); 3) with the first inner encoding process, a portion of the output bit strings from the second outer encoding may be used as input in the spc block process to generate a partial output bit string $p_1$; 4) with the second inner encoding process, portions of the output bit strings from the second outer encoding and the output bit strings from the first inner encoding may be used as input in the spc block process and the acc block process to generate output bit strings $p_2$ and $p_3$; 5) with the first inner encoding process, the remaining output bit string $p_4$ of the first inner encoding may be generated by way of the spc block process and the acc block process using portions of the output bit strings from the second outer encoding, the output bit strings of the first inner encoding, and the output bit strings of the second inner encoding as input.

While the present invention is described above with reference to certain preferred embodiments, the person having ordinary skill in the corresponding field of art would understand that various modifications and alterations can be made to the present invention without departing from the spirit and scope of the present invention defined by the scope of claims set forth below.

What is claimed is:

1. An apparatus for LDPC encoding, the apparatus comprising:
   a first outer encoding module configured to output a pre-coding bit string by using a portion of information bit strings that are to be encoded;
   a second outer encoding module configured to perform repetition and permutation operations for the pre-coding bit string and a remainder of the information bit strings;
   a first inner encoding module configured to output a portion of parity bit strings by way of a single parity check operation on bit strings outputted from the second outer encoding module; and
   a second inner encoding module configured to output parity bit strings by way of an accumulator operation with the bit strings outputted from the second outer encoding module and the portion of parity bit strings outputted from the first inner encoding module used as input,
   wherein the first inner encoding module uses a portion of parity bits outputted from the second inner encoding module as additional input in outputting a remainder of parity bit strings by way of an accumulator operation.

2. The apparatus for LDPC encoding according to claim 1, wherein the first outer encoding module outputs the pre-coding bits by way of an accumulator operation.

3. The apparatus for LDPC encoding according to claim 1, wherein the first inner encoding module and the second inner encoding module are connected via an outer connection line, and the portion of the parity bit strings of the second inner encoding module is inputted to the first inner encoding module via the outer connection line.

4. The apparatus for LDPC encoding according to claim 1, wherein the first outer encoding module comprises a plurality of variable nodes and check nodes, and the check nodes and variable nodes are connected as a zigzag closed loop having a connection degree of 2.

5. The apparatus for LDPC encoding according to claim 4, wherein variable nodes of the second outer encoding module are connected with check nodes of the first inner encoding module and the second inner encoding modules in multiple connection degrees.

6. The apparatus for LDPC encoding according to claim 4, wherein the first inner encoding module has a portion of variable nodes and a portion of check nodes thereof connected in a connection degree of 1 and remainders of the variable nodes and the check nodes thereof connected in a connection degree of 2.

7. The apparatus for LDPC encoding according to claim 3, wherein the second inner encoding module has at least one variable node thereof connected with at least one check node of the first inner encoding module via the outer connection line.

8. A method for LDPC encoding, the method comprising:
a first outer encoding step of outputting a pre-coding bit string by using a portion of information bit strings that are to be encoded;
a second outer encoding step of performing repetition and permutation operations for the pre-coding bit string and a remainder of the information bit strings;
a first inner encoding step of outputting a portion of parity bit strings by way of a single parity check operation on bit strings outputted in the second outer encoding step; and
a second inner encoding step of outputting parity bit strings by way of a single parity check operation and an accumulator operation using bit strings outputted in the second outer encoding step and a portion of parity bit strings outputted in the first inner encoding step,
wherein the first inner encoding step uses a portion of parity bits outputted in the second inner encoding step as input in outputting a remainder of parity bit strings by way of a single parity check operation and an accumulator operation.

9. The method for LDPC encoding according to claim 8, wherein the first inner encoding step comprises receiving a portion of the parity bit strings outputted in the second inner encoding step as input via an outer connection line.

* * * * *